US008823534B2

(12) United States Patent
Kuystermans

(10) Patent No.: US 8,823,534 B2
(45) Date of Patent: Sep. 2, 2014

(54) ELECTRICITY METER TAMPERING DETECTION

(75) Inventor: Marco Kuystermans, Helmond (NL)

(73) Assignee: NXP, B.V., Eindhoven (NL)

( * ) Notice: Subject to any disclaimer, the term of this patent is extended or adjusted under 35 U.S.C. 154(b) by 235 days.

(21) Appl. No.: 13/378,251

(22) PCT Filed: Jul. 8, 2010

(86) PCT No.: PCT/IB2010/053126
§ 371 (c)(1),
(2), (4) Date: Dec. 22, 2011

(87) PCT Pub. No.: WO2011/004336
PCT Pub. Date: Jan. 13, 2011

(65) Prior Publication Data
US 2012/0092177 A1 Apr. 19, 2012

(30) Foreign Application Priority Data
Jul. 8, 2009 (EP) ..................... 09164857

(51) Int. Cl.
G08B 21/00 (2006.01)
G08B 23/00 (2006.01)
G01R 1/00 (2006.01)
G01R 31/11 (2006.01)
G01R 31/02 (2006.01)
H01R 39/00 (2006.01)

(52) U.S. Cl.
USPC ........ 340/635; 340/637; 340/870.2; 324/110; 324/543; 324/534; 439/10

(58) Field of Classification Search
USPC ................... 340/635, 637; 324/110
See application file for complete search history.

(56) References Cited

U.S. PATENT DOCUMENTS

| 5,293,115 | A | | 3/1994 | Swanson |
| 5,473,322 | A | * | 12/1995 | Carney ..................... 340/870.02 |
| 5,488,565 | A | * | 1/1996 | Kennon et al. ................. 700/306 |
| 5,650,728 | A | * | 7/1997 | Rhein et al. .................... 324/543 |
| 6,232,886 | B1 | * | 5/2001 | Morand ................... 340/870.02 |
| 6,233,886 | B1 | | 5/2001 | Andres |
| 2003/0128134 | A1 | | 7/2003 | Fierro et al. |
| 2004/0082203 | A1 | | 4/2004 | Logvinov et al. |
| 2007/0150237 | A1 | * | 6/2007 | Swarztrauber et al. ........ 702/188 |
| 2008/0204272 | A1 | | 8/2008 | Ehrke et al. |
| 2009/0243866 | A1 | * | 10/2009 | Murphy ......................... 340/635 |

FOREIGN PATENT DOCUMENTS

EP  0 493 964 A2  7/1992

OTHER PUBLICATIONS

International Search Report for Patent Application No. PCT/IB2010/053126 (Sep. 29, 2010).

* cited by examiner

Primary Examiner — Jack K Wang

(57) ABSTRACT

Tampering with an electricity network is detected from an electricity meter by transmitting a probe signal over at least part of the electricity network (12) from a signal source (106a) in the electricity meter (10). A reflected signal produced by reflection of the probe signal in the electricity network (12) is received back. The reflected signal is compared with a reference signal. An alarm signal is generated when said comparing detects a deviation between the reflection signal and the reference signal, in particular when reflections from a new position on the electricity network near the electricity meter are detected.

9 Claims, 1 Drawing Sheet

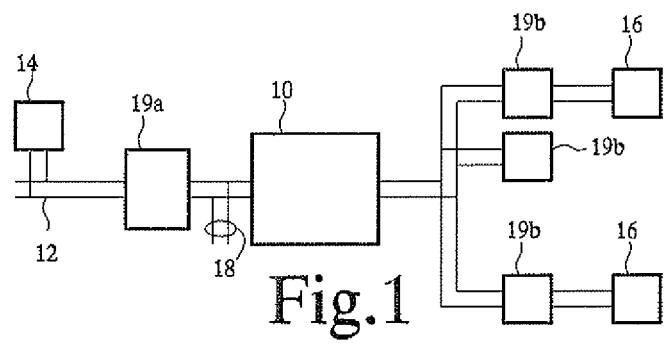
Fig.1
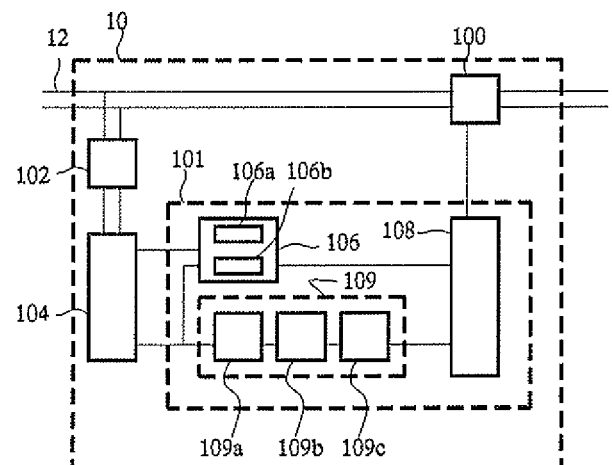
Fig.1a
Fig.2
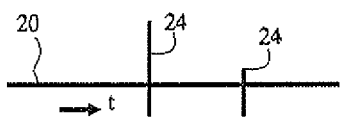
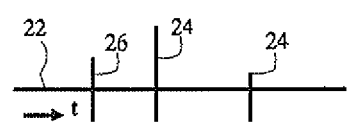

ELECTRICITY METER TAMPERING DETECTION

FIELD OF THE INVENTION

The invention relates to a method of detecting possible theft of electricity and an detection device for detecting tampering with an electricity network. In an embodiment an electricity meter is provided that is adapted to detect tampering.

BACKGROUND OF THE INVENTION

Theft of electricity involves tapping current from the electricity network while avoiding that the current is registered by the electricity meter that is used to bill the user. Often this is done by connecting power cables to the feed into a house in front of the electricity meter, or by tampering with the operation of the electricity meter itself. Currently, detection of this form of theft is cumbersome. Usually it involves visual inspection by a human inspector.

Technical alternatives involve the use of electricity meters that are protected against tampering. U.S. Pat. No. 6,232,886 discloses an electricity meter with a movement detector for example. However, movement detection does not provide for detection of forms of theft wherein power lines are tapped at some distance from the electricity meter.

Another solution involves measuring current supply at a distribution point and comparing the cumulative measured current with registered current use at homes connected to the distribution point. With conventional electricity meters such a measurement involves measured current use over an extended period of time. But even if all users have accepted more modern electricity meters that can be read off at a distance almost instantaneously, such a measurement still does not tell where the current theft occurs.

SUMMARY OF THE INVENTION

Among others, it is an object to provide for a technique that makes it possible to detect theft of electricity even if the electricity meter is not tampered with.

An electricity meter circuit according to claim 1 is provided. The meter circuit may be an integrated circuit for use in an electricity meter for example, or a circuit board for use in such a meter, or a complete meter. The meter circuit provides for detection of reflection of signals transmitted from the electricity meter over a power line. By comparing the reflections with a reference changes in connections to the power lines in the environment of the meter can be detected from the meter. This makes it possible to automatically detect tampering at a distance from the meter. The electricity meter may send a message to a data gathering unit of the electricity company when tampering is detected in this way, for example.

In an embodiment the reference signal may be stored in a memory. It may obtained by storing a reflection that was received when it may be assumed that no tampering has taken place, for example in the presence of an inspector or upon installation of the meter.

The time delay of the first reflection due to tampering indicates the distance between the meter and the position of tampering. In an embodiment a distance window is applied to detection of the reflections during tampering detection. In this way false detections due to changes further away from the meter can be eliminated.

In an embodiment the meter circuit keeps a count of repeated reflection measurements in which deviations have been detected and an alarm is generated only if the count exceeds a threshold. In this way alarms due temporary changes or false alarms can be reduced. A count of detections of repeated reflection measurements performed during a period of predetermined length may be used.

In an embodiment the meter circuit comprises a transponder for communicating with the electricity company, for example to report electricity use. In a further embodiment messages received via the transponder are used to trigger the detection of reflections. In this way testing in different electricity meters can be coordinated.

In an embodiment reflections of signals transmitted by the transponder may be used to detect tampering. Thus, tampering detection can be masked and/or no additional signal generator is needed. In another embodiment a separate signal generator may be included in the circuit. In this way the signals can be optimized for detection of reflections. A system with a plurality of electricity meters of this type may be realized, with a common information gathering unit to receive and record alarm signals from the plurality of electricity meters.

BRIEF DESCRIPTION OF THE DRAWINGS

These and other objects and advantageous aspects will become apparent from a description of exemplary embodiments, using the following Figures FIG. 1 shows part of an electricity network
FIG. 1a shows an electricity meter in more detail
FIG. 2 shows reflections

DETAILED DESCRIPTION OF EXEMPLARY EMBODIMENTS

FIG. 1 shows part of an electricity network. The network comprises an electricity meter 10, a power cable 12 and an information gathering unit 14. Local loads 16 are coupled to power cable 12 via electricity meter 10. In addition an illegal tap 18 coupled to power cable is shown. It should be emphasized that only part of the network is shown. Typically, the network also comprises generators, transformers, circuit breakers etc (not shown). Near electricity meter 10, a master circuit breaker 19a and circuit breakers 19b of various groups of power outlets may be provided.

FIG. 1a shows electricity meter 10 in more detail. Electricity meter 10 comprises a sensor 100, a meter integrated circuit 101, a transformer 102, and a hybrid 104. Meter integrated circuit 101 comprises a transponder 106, a control circuit 108 and a detector circuit 109. Sensor 100 is coupled between power cable 12 and local loads 16 and sensor 100 has an output coupled to control circuit 108. Control circuit 108 may be a programmable microcontroller circuit, with a stored program to cause it to function as will be described. Transformer 102 has a primary side coupled to power cable 12 and a secondary side coupled to transponder 106 via hybrid 104. Transponder may contain a receiver 106a and a transmitter 106b for receiving and transmitting signals from and towards power cable 12 respectively.

Hybrid 104 has a first terminal coupled to transformer 102 and a second terminal coupled to an output of transponder 106, for passing signals from transponder 106 to transformer 102. Hybrid 104 has a third terminal coupled to an input of transponder 106. Hybrid 104 splits off signals coming from transformer 102 and supplies to the input of transponder 106. Detector circuit 109 has an input coupled to the input of transponder 106 and an interface coupled to control circuit 108. Detector circuit 109 comprises a sampling circuit 109a, an A/D converter 109b and a signal memory 109c, coupled in cascade.

In operation electricity meter performs conventional metering operations. Sensor 100 may sense current passed through electricity meter 10 and it may signal a result of said sensing (e.g. measured cumulative current use, or a measurement of an instantaneous current value to control circuit 108. Control circuit 108 may cause transponder 106 to send report signals reporting sensing results. Hybrid 104 and transformer 102 pass the report signal to power cable 12, which in turn passes the report signal to information gathering unit 14, e.g. for billing purposes.

When transponder 106 causes a signal on power cable 12, power cable 12 acts as a transmission line for that signal. Inevitably, however, signal reflections occur along this transmission line, for example at the master circuit breaker 19a and at points where the power cable is attached to electrodes. Furthermore, reflections will occur if an illegal tap 18 is connected to power cable 12.

FIG. 2 schematically shows reflection signals 20, 22 that may occur with and without a tap respectively, as a function of time in response to a pulse signal. The reflection signal 20 that may be obtained without tap may contain a number of primary reflections 24 at different time points due to reflecting points along power cable 12, with different time delays from transmission of the pulse that correspond to the distance between electricity meter 10 and the points of reflection. In addition, there may be later secondary reflections that arrive after successively reflecting from different points. In the signal 22 that may be obtained when a tap is present, an additional primary reflection 26 occurs due to reflection from the tap, as well as additional secondary reflections. The time delay between transmission of the signal and reception of the primary reflection 26 due to the tap is indicative for the distance between electricity meter 10 and the tap.

When transponder 106 causes a signal on power cable 12, the reflected signal returns to electricity meter 10, in which it is fed back to transponder 106 via transformer 102 and hybrid 104. Detector circuit 109 samples the reflected signal, digitizes it and stores the digitized sampled values in memory 109c. Control circuit 108 reads the values of the reflected signal and compares them with a reference signal, which corresponds to an expected reflected signal in the absence of any illegal taps 18. The reference signal may be kept in memory 109c as well, or it may be represented by data in a memory (not shown) of control circuit 108. When control circuit 108 detects that a deviation between the reflected signal and the reference signal exceeds a predetermined threshold, control circuit 108 causes transponder 106 to transmit a further signal (an alarm signal) to information gathering unit 14 to report the deviation, which is taken to indicate at least a suspicion that an illegal tap has occurred. Transponder 106 may be coupled to detector circuit 109 to trigger recording of values from a time point in predetermined relation to the time of transmission. Alternatively, control circuit 108 may provide the trigger signal or values may be recorded continuously and control circuit 108 may select a set of recorded values dependent on the time point of transmission of the signal.

In an embodiment, control circuit 108 is configured to use the time delay of the primary reflection to decide whether or not send the alarm signal. This may be done for example only when the primary deviating reflection (first deviating part of the signal) in excess of the threshold occurs within a predetermined time window from transmission of the signal. The time window may define a maximum distance from the electricity meter 10 from which reflections are monitored. This prevents that uncontrolled, but legal load variations further away from electricity meter 10 can lead to false alarms.

In an embodiment, control circuit 108 is configured to send the alarm signal only if a deviation from the reference signal is detected in repeated reflection experiments. This also reduces false alarms. Control circuit 108 may be configured to keep a count of a number of times that a deviation was measured, or of a duration of a time interval in which deviations where detected. In this embodiment control circuit 108 is configured to generate the alarm signal when this count, or this duration, exceeds a further threshold.

In an embodiment control circuit 108 is configured to establish the reference signal on installation, or in response to an update control signal received by transponder 106. This may be done by copying of the digitized sample values from detector circuit 109 to a memory for the reference signal. In an embodiment an average obtained from repeated measurements may be used as reference signal. In an embodiment, electricity meter 10 may be provided with a control switch (not shown) in a tamper protected housing and coupled to integrated circuit 101 to control storing of the reference signal. Thus, a service engineer may set the reference signal when needed. In another embodiment control circuit may be configured to detect a signal received by transponder 106 with a code to store a measured reference signal or average reference signal. As this introduces a risk of tampering a protected communication is preferably used for this, involving for example a known protocol to prove that the source of the signal is in possession of predetermined secret information.

The selection of time points timing of transmission of probe signals for the detection of reflections and/or comparison of received reflections with the reference signal may be selected by control circuit 108. Periodic or random timing may be used for example. However, it is preferred that the control circuit 108 is configured to select the timing based on timing selection signals received by transponder 106. This makes it possible to avoid interference between measurements by different electricity meters 10. Information gathering unit 18 may be configured to send timing selection signals successively addressed to different electricity meters 10 each to trigger a different reflection measurement.

In an embodiment a dedicated probe signal is used to elicit the reflection. A dedicated probe signal generator may be included with transponder 106 for this purpose, or transponder 106 may be designed to generate the prone signal as well as message signals. A pulse containing an oscillating signal may be used as a probe signal for example. A comparison of samples of time dependent signals may be used to detect deviations in the reflection as described. However, alternatively the reflected signal may be preprocessed before the comparison. Filtering may be performed and/or envelope detection for example. Although an example of a pulsed probe signal has been described, it should be appreciated that other types of signal may be used. For example, a frequency swept signal may be used, so that the reflected signal is also a frequency swept signal, but with a delay frequency sweep. In this case detector 109 may comprise a mixer to mix down the reflected signal with a similarly frequency swept local oscillator, so that a signal results wherein an added reflection at a certain distance results in spectrum with a frequency peak at a frequency corresponding to that distance. In this case a frequency window, applied e.g. by means of a low pass filter may be used to distinguish nearby reflections. Deviations may be detected by applying a Fourier transform to the mixed down signal and detecting deviations from a reference data derived by applying a Fourier transform to a reference signal obtained earlier.

Instead of using a dedicated probe signal, reflections resulting from regular messages sent via the power lines may be used to detect tampering. But transmission of messages via the power lines is not indispensable. Although an embodiment has been described wherein a transponder 106 is used to transmit messages and alarms concerning electricity via power lines 12, it should be appreciated that alternatively other forms of transmission, such as wireless transmission or transmission via a connection to the Internet may be used. In this case a signal generator is preferably added to meter integrated circuit to supply probe signals to the power lines instead of transponder 106. Although use of a hybrid and a transformer has been shown, to facilitate coupling to the power lines, it should be appreciated that other forms of coupling may be used, including direct coupling or capacitive coupling of detector circuit 109 and transponder 106 or a signal generator to the power lines. Although an embodiment has been shown wherein a single meter integrated circuit 101 is used to perform the described functions it should be appreciated that the implementation of components of this circuit may be distributed over a plurality of integrated circuits and/or other devices.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the power lines, the Internet or other wired or wireless telecommunication systems. Any reference signs in the claims should not be construed as limiting the scope.

The invention claimed is:

1. An electricity meter circuit, comprising:
    a signal source coupled to an output for coupling to power lines of an electricity network;
    a signal receiver with an input for coupling to the power lines;
    a control circuit, configured to record a reflection signal received by the signal receiver upon transmission of a signal by the signal source, to compare the reflection signal with a reference signal and to generate an alarm signal when a deviation from the reference signal is detected in the reflection signal,
    wherein the control circuit is configured to select the deviation from the reflection signal based on a signal property of the deviation that indicates a signal path length to a source of the reflection that caused the deviation, and to generate the alarm signal only when the signal path length for the deviation lies within a predetermined window of path lengths.

2. An electricity meter circuit according to claim 1, comprising a memory for storing information about the reference signal for the comparison with the reflection signal.

3. An electricity meter circuit according to claim 1, wherein the control circuit is configured to obtain the reference signal from a further reflection signal received by the signal receiver prior to said reflection signal.

4. An electricity meter circuit according to claim 1, wherein the control circuit is configured to keep a count of reflection signals in which deviations from the reference signal have been detected and to generate the alarm signal only when said count exceeds a predetermined a predetermined threshold.

5. An electricity meter circuit according to claim 1, comprising a transponder coupled to the control circuit, the control circuit being configured to detect the reflection signal at a time point selected under control by a message received by the transponder.

6. An electricity meter comprising an electricity meter circuit as claimed in claim 1.

7. An electricity meter according to claim 5, furthermore comprising a current sensor coupled to at least one of the power lines and a transponder, the control circuit being configured to cause the transponder to transmit a message reporting electricity use detected by the current sensor as well as to cause the transponder to transmit a message comprising the alarm signal when the deviation from the reference signal is detected in the reflection signal.

8. An electricity distribution system comprising a plurality of electricity meters as claimed in claim 5, and an information gathering unit configured to receive and record alarm signals from the plurality of electricity meters.

9. A method of detecting tampering with an electricity network, the method comprising:
    transmitting a probe signal over at least part of the electricity network from a signal source in an electricity meter;
    receiving, in the electricity meter, a reflected signal produced by reflection of the probe signal in the electricity network;
    comparing the reflected signal with a reference signal;
    generating an alarm signal when said comparing detects a deviation between the reflection signal and the reference signal, detecting said deviation only when a property of the deviation indicates that a signal path length to a source of the reflection that caused the deviation lies within a predetermined window of path lengths.

* * * * *